(12) United States Patent
Boyd et al.

(10) Patent No.: US 6,845,778 B2
(45) Date of Patent: Jan. 25, 2005

(54) IN-SITU LOCAL HEATING USING MEGASONIC TRANSDUCER RESONATOR

(75) Inventors: John M. Boyd, Atascadero, CA (US); Katrina Mikhaylich, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 199 days.

(21) Appl. No.: 10/112,639

(22) Filed: Mar. 29, 2002

(65) Prior Publication Data

US 2003/0183246 A1 Oct. 2, 2003

(51) Int. Cl.$^7$ ................................................ B08B 7/04
(52) U.S. Cl. ..................... 134/1.3; 134/1; 134/184; 134/902; 134/33; 134/19; 134/157
(58) Field of Search ......................... 134/902, 1, 105, 134/184, 1.3, 19, 32, 33, 34, 157

(56) References Cited

U.S. PATENT DOCUMENTS

| | | | | |
|---|---|---|---|---|
| 3,717,539 A | * | 2/1973 | Roberts .................... 156/498 |
| 4,572,753 A | * | 2/1986 | Bach ........................ 156/73.1 |
| 4,869,278 A | * | 9/1989 | Bran .......................... 134/184 |
| 5,286,657 A | * | 2/1994 | Bran .......................... 134/1.3 |
| 5,365,960 A | * | 11/1994 | Bran .......................... 134/184 |
| 5,368,054 A | * | 11/1994 | Koretsky et al. ............ 134/153 |
| 5,421,923 A | * | 6/1995 | Clarke et al. .............. 156/73.1 |
| 5,523,058 A | * | 6/1996 | Umemura et al. .......... 422/128 |
| 5,996,601 A | * | 12/1999 | Kern et al. ................. 134/184 |
| 6,140,744 A | * | 10/2000 | Bran .......................... 310/346 |
| 6,202,658 B1 | * | 3/2001 | Fishkin et al. ............. 134/147 |
| 6,295,999 B1 | | 10/2001 | Bran |
| 6,318,248 B1 | * | 11/2001 | Capodieci .................... 99/451 |
| 6,385,805 B2 | * | 5/2002 | Konishi et al. ................ 15/77 |
| 6,539,952 B2 | * | 4/2003 | Itzkowitz .................... 134/1.3 |
| 6,622,312 B2 | * | 9/2003 | Rabinowicz .................. 2/401 |
| 6,644,327 B1 | * | 11/2003 | Mitsumori et al. .......... 134/184 |

* cited by examiner

*Primary Examiner*—Alexander Markoff
(74) *Attorney, Agent, or Firm*—Martine, Penilla & Gencarella, LLP

(57) ABSTRACT

An apparatus for cleaning a semiconductor substrate is provided. In embodiment of the present invention, a megasonic cleaner capable of providing localized heating is provided. The megasonic cleaner includes a transducer and a resonator. The resonator is configured to propagate energy from the transducer. The resonator has a first and a second end, the first end is operatively coupled to the transducer and the second end is configured to provide localized heating while propagating the energy from the transducer. A system for cleaning a semiconductor substrate through megasonic cleaning and a method for cleaning a semiconductor substrate is also provided.

24 Claims, 12 Drawing Sheets

IN-SITU LOCAL HEATING USING MEGASONIC TRANSDUCER RESONATOR

BACKGROUND OF THE INVENTION

The present invention relates generally to surface cleaning and, more particularly, to a method and apparatus for megasonic cleaning of a semiconductor substrate following fabrication processes.

Megasonic cleaning is widely used in semiconductor manufacturing operations and can be employed in a batch cleaning process or a single wafer cleaning process. For a batch cleaning process, the vibrations of a megasonic transducer creates sonic pressure waves in the liquid of the cleaning tank which contains a batch of semiconductor substrates. A single wafer megasonic cleaning process uses a relatively small transducer above a rotating wafer, wherein the transducer is scanned across the wafer, or in the case of full immersion a single wafer tank system is used. In each case, the main particle removal mechanisms with megasonic cleaning is due to cavitation and acoustic streaming. Cavitation is the rapid forming and collapsing of microscopic bubbles in a liquid medium under the action of sonic agitation. Upon collapse, the bubbles release energy which assists in particle removal through breaking the various adhesion forces which adhere the particle to the substrate. Sonic agitation involves subjecting the liquid to acoustic energy waves. Under megasonic rinsing, these acoustic waves occur at frequencies between 0.4 and 1.5 Megahertz (MHz), inclusive.

FIG. 1A is a schematic diagram of a batch megasonic cleaning system. Tank 100 is filled with a cleaning solution. Wafer holder 102 includes a batch of wafers to be cleaned. Transducer 104 creates pressure waves through sonic energy with frequencies near 1 Megahertz. These pressure waves in concert with the appropriate chemistry to control particle re-adhesion provide the cleaning action. Because of the long cleaning time required for batch cleaning systems, as well as chemical usage, efforts have been focused on single wafer cleaning systems in order to decrease chemical usage, increase wafer-to-wafer control, and decrease defects in accordance with the International Technology Roadmap for Semiconductors (ITRS) requirements. Batch systems suffer from another disadvantage in that the delivery of megasonic energy to the multiple wafers in the tank is non-uniform and can result in 'hot spots' due to constructive interference, or 'cold spots' due to destructive interference, each being caused by reflection of the megasonic waves from both the multiple wafers and from the megasonic tank. Therefore, a higher megasonic energy as well as multiple transducer arrays must be applied in order to reach all regions of the wafers in wafer holder 102. FIG. 1B is a schematic diagram of a single wafer cleaning tank. Here, tank 106 is filled with a cleaning solution. Wafer 108 is submerged in the cleaning solution of tank 106. Transducer 110 supplies the energy to clean the wafer. Furthermore, particles remain inside the tank requiring that the cleaning fluid be replaced or recirculated and filtered regularly.

FIG. 1C is a schematic diagram of nozzle-type megasonic cleaning configuration for a single wafer. Nozzle 112 provides fluid stream 114 through which the megasonic energy is coupled. Transducer 116, which is connected to power supply 118, provides the megasonic energy through the fluid stream 114 to the substrate as the fluid stream flows through the nozzle. Megasonic energy supplied through fluid stream 114 provides the cleaning mechanism to clean wafer 120. One shortcoming of the nozzle cleaning configuration includes requiring a high flow rate of the fluid stream to maintain contact between transducer 116 and wafer 120. The fluid stream generated through nozzle 112 covers a small area, therefore, a fairly high megasonic energy is needed to clean the wafer, which in turn, may cause damage to the surface of the wafer. The high energy required also necessitates cooling of the transducer, which is another reason for the high flow rates required. This makes cleaning using a cleaning chemistry other than deionized water impractical, due to cost and effluent handling requirements. Banding may also occur because of the difficulty to provide full cleaning coverage of the entire wafer surface with the small coverage area of the fluid stream.

Additionally, the cleaning chemistries for single wafer cleaning processes are highly reactive and often require application at elevated temperatures to provide effective cleaning at low cleaning times, particularly for post etch cleaning applications. Each of the single wafer cleaning configurations described above use batch heating systems with chemical re-circulation, or in the case of a nozzle-type transducer, batch heating with heated delivery lines so that the temperature is maintained for the cleaning chemistry to optimally clean the wafer surface.

In view of the foregoing, there is a need for a method and apparatus to provide a single wafer megasonic cleaning configuration that is capable of heating the cleaning chemistry at the point of contact with the wafer which simplifies heating of the chemistry, and improves process control of the heated chemistry.

SUMMARY OF THE INVENTION

Broadly speaking, the present invention fills this need by providing a resonator of a megasonic cleaner that is configured to provide localized heating control to a region of liquid that couples the resonator and a substrate. It should be appreciated that the present invention can be implemented in numerous ways, including as an apparatus, a system, a device, or a method. Several inventive embodiments of the present invention are described below.

In accordance with one aspect of the present invention, an apparatus for cleaning a semiconductor substrate is provided. The apparatus includes a transducer and a resonator. The resonator is configured to propagate energy from the transducer. The resonator has a bottom surface and a top surface, the top surface is operatively coupled to the transducer and the bottom surface is configured to provide localized heating while propagating the energy from the transducer.

In accordance with another aspect of the invention, a system for cleaning a semiconductor substrate is provided. The system includes a substrate support configured to support and rotate a semiconductor substrate about an axis of the semiconductor substrate. A megasonic cleaner is included. The megasonic cleaner is configured to move radially above a top surface of the semiconductor substrate. The megasonic cleaner includes a transducer and a resonator. The resonator is configured to propagate energy from the transducer. The resonator has a top surface and a bottom surface, where the top surface is operatively coupled to the transducer. The bottom surface is configured to contact a liquid disposed on the top surface of the semiconductor substrate. Additionally, the bottom surface is adapted to provide localized heating to elevate a temperature of the liquid in contact with the bottom surface while propagating the energy from the transducer through the liquid to the substrate.

In accordance with yet another aspect of the invention, a method for cleaning a semiconductor substrate is provided. The method initiates with introducing a liquid onto the top surface of the semiconductor substrate. Then, a bottom surface of a resonator is coupled to a top surface of a semiconductor substrate through the liquid. Next, sonic energy is transmitted through the resonator to the liquid. Then, the liquid is heated through the bottom surface of the resonator. A method for applying localized heating to a cleaning chemistry during a cleaning operation of a semiconductor substrate is also provided. The method initiates with positioning a resonator to contact a surface of a cleaning chemistry applied to a semiconductor substrate. Then, heat energy is simultaneously applied with the sonic energy through the resonator to clean the semiconductor substrate.

In accordance with another aspect of the invention, a method for applying localized heating to a cleaning chemistry during a cleaning operation of a semiconductor substrate is provided. The method initiates with positioning a resonator to contact a surface of a cleaning chemistry applied to a semiconductor substrate. Then, heat energy and sonic energy are simultaneously applied through the resonator to clean the semiconductor substrate.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE INVENTION

Figure 1A:
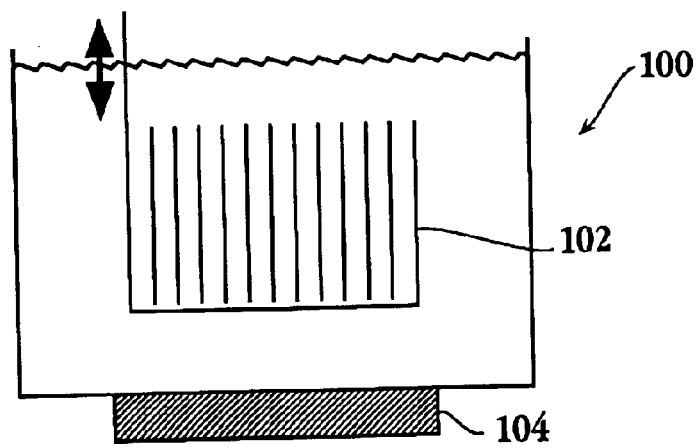
FIG. 1A is a schematic diagram of a batch megasonic cleaning system.
Figure 1B:
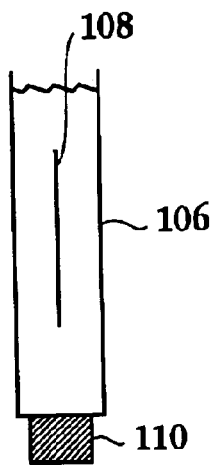
FIG. 1B is a schematic diagram of a single wafer cleaning tank.
Figure 1C:
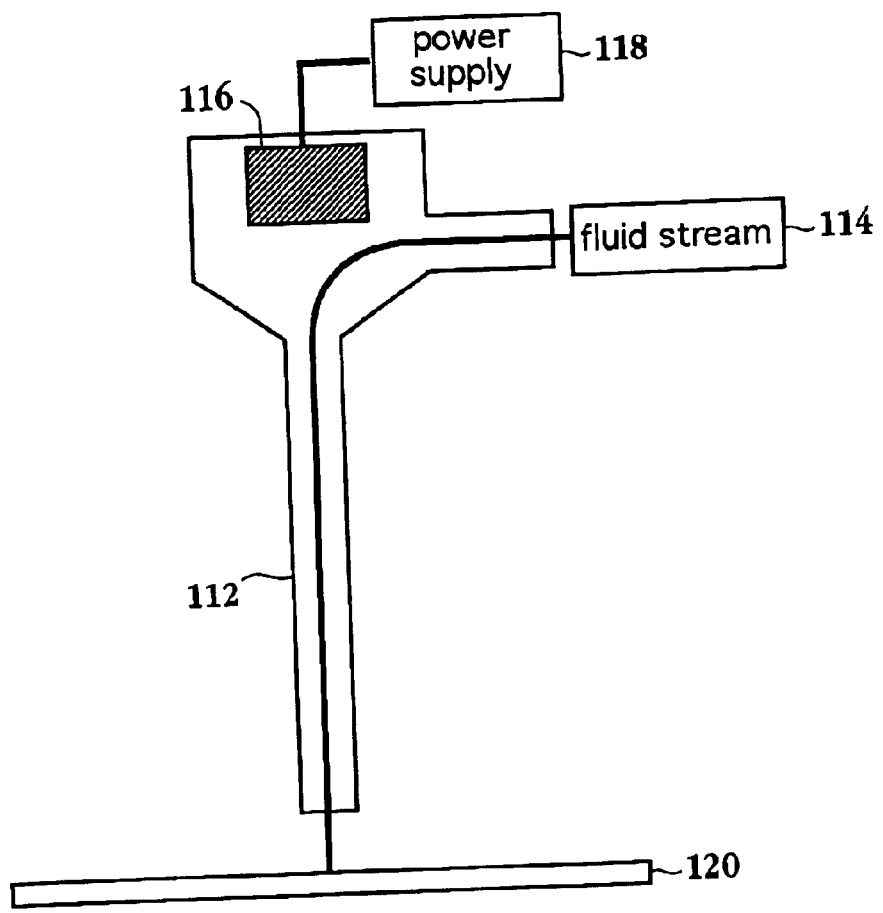
FIG. 1C is a schematic diagram of nozzle cleaning configuration for a single wafer.

Several exemplary embodiments of the invention will now be described in detail with reference to the accompanying drawings. FIGS. 1A, 1B and 1C are discussed above in the "Background of the Invention" section.

The embodiments of the present invention provide an apparatus and a method for cleaning a semiconductor substrate with a megasonic cleaning device, where the cleaning device simultaneously provides localized heating and sonic energy to clean the semiconductor substrate. The localized heating enables elevating a temperature of a liquid, such as a cleaning chemistry for a single wafer cleaning operation, disposed over the top surface of the substrate. Thus, the cleaning chemistry for a single wafer cleaning operation can be heated to increase the reactivity and effectiveness of the cleaning chemistry. The increased reactivity, in conjunction with the cleaning mechanism of the megasonic cleaner, provides an improved throughput for the cleaning operation as each semiconductor substrate spends less time in the cleaning operation. Additionally, the geometric configuration of the resonator can be designed to provide minimal reflected power, as well as allowing improved penetration into high aspect ratio features. In one embodiment, the transducer of the megasonic cleaner is cooled so that the elevated temperature of the resonator does not overheat the transducer. As used herein, the terms wafer and semiconductor substrate are interchangeable.

Figure 2A:
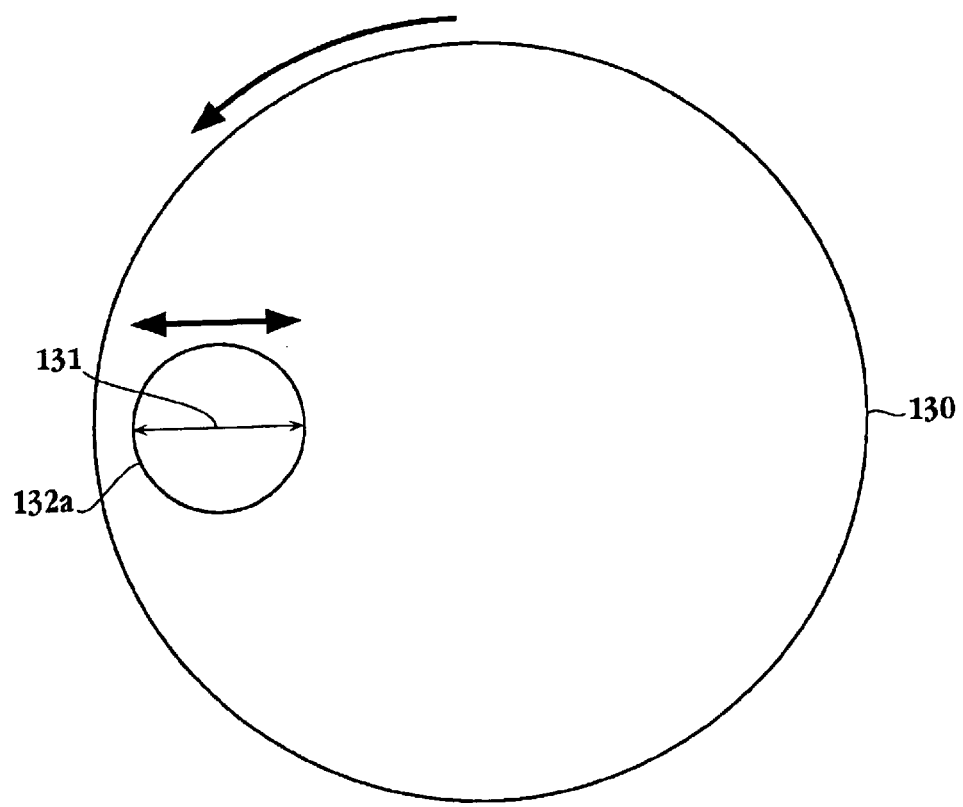
FIG. 2A is a top view of a high level schematic diagram of a megasonic cleaner disposed over a semiconductor substrate in accordance with one embodiment of the invention.

FIG. 2A is a top view of a high level schematic diagram of a megasonic cleaner disposed over a semiconductor substrate in accordance with one embodiment of the invention. Substrate 130 is caused to rotate through rollers or some other suitable rotating mechanism for a semiconductor substrate cleaning process. Megasonic cleaner 132A moves radially over substrate 130 while the substrate is rotating. It will be apparent to one skilled in the art that a process arm affixed to megasonic cleaner 132A allows for the radial movement of the megasonic cleaner over substrate 130. In one embodiment, the energy delivered to the surface of semiconductor substrate 130 by megasonic cleaner 132 is less than about 5 Watts (W)/square centimeter ($cm^2$). In a preferred embodiment the megasonic energy delivered to a surface of semiconductor substrate 130 is between about 3 Watts (W)/square centimeter ($cm^2$) and about 5 $W/cm^2$, although depending on the sensitivity of the electronic devices present on the substrate, the megasonic energy can be significantly higher provided there is no damage to the devices at the higher energy.

Still referring to FIG. 2A, diameter 131 represents the diameter of the surface of the megasonic cleaner 132A exposed to a liquid disposed over substrate 130. In one embodiment, where substrate 130 is a 200 mm (8 inch) wafer, diameter 131 is between about 1 inch and about 3 inches. In a preferred embodiment, the diameter is about 1.5 inches for a 200 mm wafer. It should be appreciated that for a 300 mm wafer the size of the megasonic cleaner is scaled accordingly to keep a substantially constant ratio between the surface area of the megasonic cleaner and the wafer. This allows the energy delivered to the surface of the wafer to remain substantially constant between the different size wafers. In addition, the same portion of the 300 millimeter wafer is scanned per unit time so that the throughput is similar for either wafer size.

Figure 2B:
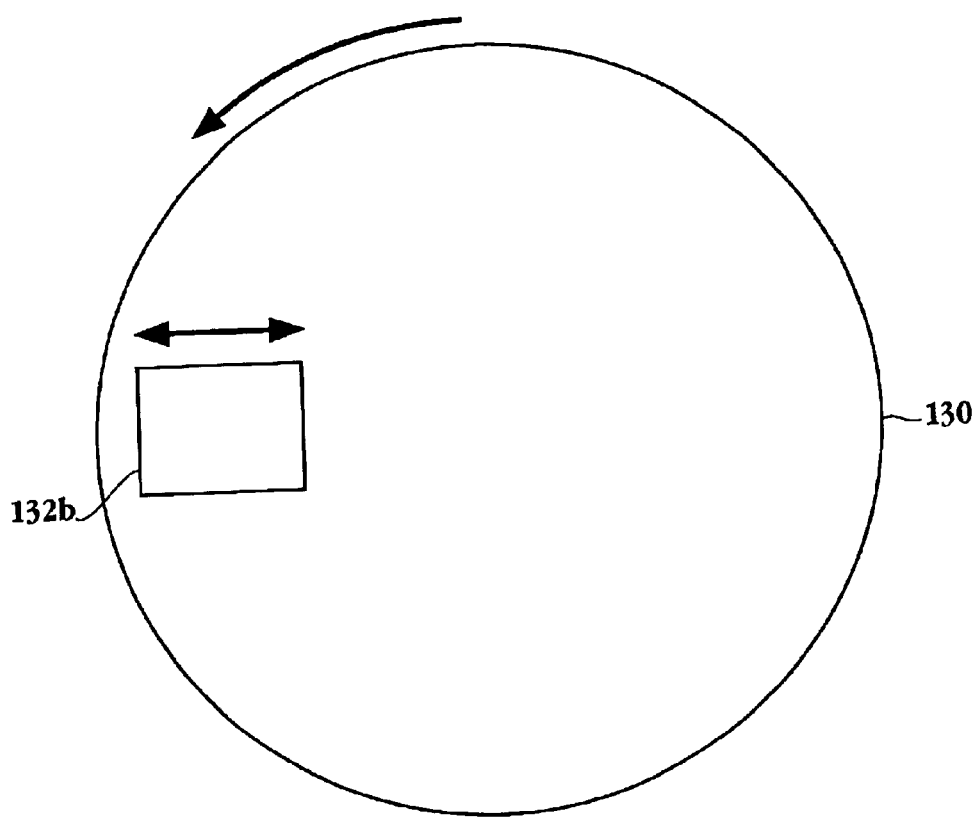
FIG. 2B is high level schematic diagram of a square shaped megasonic cleaner.
Figure 2C:
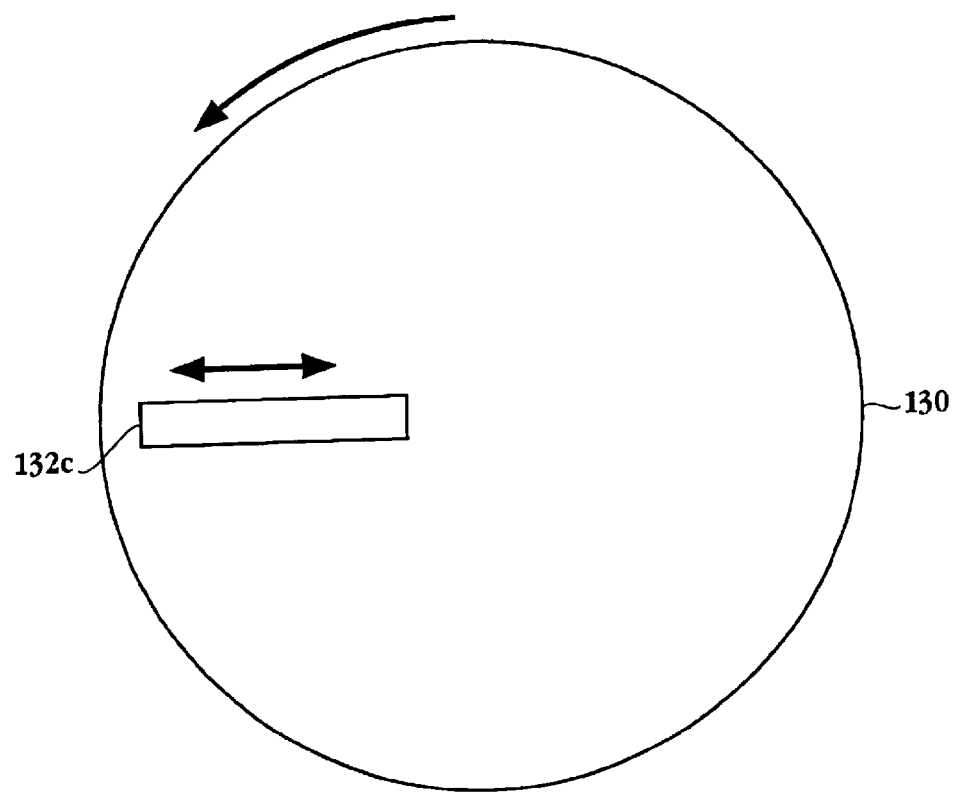
FIG. 2C is high level schematic diagram of a rod shaped megasonic cleaner.

FIGS. 2B and 2C are high level schematic diagrams of alternate shapes for megasonic cleaner 132. Megasonic cleaner 132B of FIG. 2B is square shaped while Megasonic cleaner 132C of FIG. 2C is a rod. As will be explained in more detail below, the bottom surface of the resonator of megasonic cleaner 132 can have a slight curvature in order to produce a lens effect. It should be appreciated that the shape of megasonic cleaner 132 can be any shape suitable to clean the surface of semiconductor substrate 130. That is, by keeping a ratio between the surface area of the megasonic cleaner and the surface area of the wafer substantially constant as described above, any shape can be utilized for the megasonic cleaner. One skilled in the art will appreciate that the cleaning effectiveness is a function of the power density applied to a unit area. Therefore, the surface area of the resonator of megasonic cleaner is configured to allow a power density between about 3 W/cm$^2$ and about 5 W/cm$^2$ without requiring a high megasonic energy to supply that power density, since a high megasonic energy can damage devices present on the substrate being cleaned. In addition, while the megasonic resonator may be sized to cover a large portion of the wafer, it should be appreciated that this would be less than optimal since a high dwell time will be experienced by part of the substrate, such as a middle region of the substrate. Consequently, a low dwell time is experienced elsewhere, which may result in non-uniform cleaning. Therefore, it is preferable to provide a megasonic cleaner that scans the wafer, as described with reference to FIGS. 2A–2C, to provide a uniform dwell time by correlating the process arm scan speed to the angular velocity (or radius at sweep position) of the substrate under rotation.

In one embodiment, where the megasonic cleaner is supported on a process arm and a process arm sweep rotation takes place via an electronic servomotor, the dwell time can be controlled to ensure a substantially uniform amount of work performed by the megasonic cleaner over the wafer. The servomotor combines a motion controller unit, motor driver electronics, position feedback encoder and an AC brushless motor into the form factor of a single motor. The process arm motion speed and position is directly related to spindle rotation speed during wafer processing. In one embodiment, the process arm sweep takes place through the centerline of the wafer. In order that the entire surface area of the wafer be processed equally, i.e., the amount of work done by the megasonic controller is substantially uniform over the surface of the wafer, the arm sweep motion is synchronized with the radial position. As the sweep speed is a quadratic function of the radius and area at that radius Vsweep=C/r2, where C is a proportionality constant and the dwell time is inversely proportional to the velocity, as the radius increase the dwell time of the megasonic cleaner must increase to equalize the amount of work performed over the surface of the wafer. That is, as the process arm sweeps out from the center of the wafer, the megasonic cleaner needs a longer dwell time in order to perform substantially the same amount of work.

Figure 3:
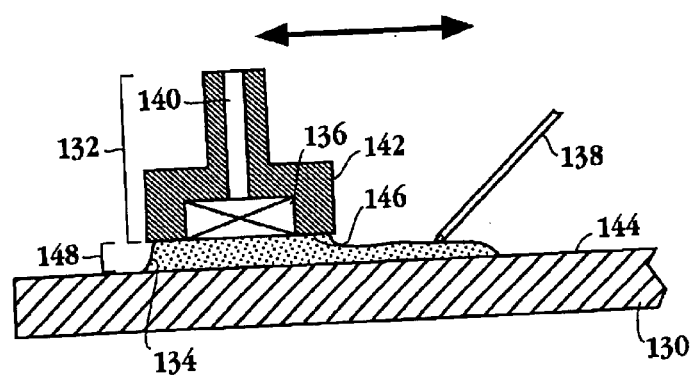
FIG. 3 is a schematic diagram of a simplified cross-sectional view of an interface between a semiconductor substrate and a megasonic cleaner in accordance with one embodiment of the invention.

FIG. 3 is a schematic diagram of a simplified cross-sectional view of an interface between a semiconductor substrate and a megasonic cleaner in accordance with one embodiment of the invention. Megasonic cleaner 132 is proximate to top surface 144 of semiconductor substrate 130. A liquid is disposed over top surface 144 of semiconductor substrate 130. In one embodiment, the liquid is puddled onto semiconductor substrate 130. Megasonic cleaner 132 is brought into contact with the liquid to form meniscus 134 which couples bottom surface 146 of the megasonic cleaner to the top surface 144 of semiconductor substrate 130. It should be appreciated that the liquid can be applied to substrate 130 through nozzle 138. In one embodiment, nozzle 138 can be affixed to the same radial arm that megasonic cleaner 132 is affixed to. In another embodiment, the liquid can be delivered to substrate 130 through at least one port in the megasonic transducer body. The liquid can be deionized water (DIW) or a cleaning chemistry designed for cleaning single wafers. Examples of single wafer cleaning chemistries include commercially available solvents, such as EKC 640, EKC 6800 and Ashland NE89 commonly used for post-etch cleaning, as well as other commercially available solvents used for post chemical mechanical Planarization (CMP) cleaning. Other cleaning chemistries include SC-1 ($NH_4OH/H_2O_2$ mixture), SC-2 ($HCl/H_2O_2$ mixture), dilute HF or ozonated DIW ($H_2O/O_3$).

Still referring to FIG. 3, megasonic cleaner 132 includes megasonic transducer 136 contained within housing 142. Power supply line 140 provides transducer 136 with the necessary power. As mentioned above, megasonic cleaner 132 can be affixed to a radial arm configured to move radially above top surface 144 of semiconductor substrate 130. Distance 148 between bottom surface 146 of megasonic cleaner 132 and top surface 144 of semiconductor substrate 130 is between about 0.5 millimeters (mm) and about 5 mm. In one embodiment, distance 148 is between about 1 mm and about 3 mm, with the distance preferably about 2 mm. As mentioned above with respect to FIGS. 2A–2C, the surface area of bottom surface 146 of megasonic cleaner 132 is configured so that a power density between about 3 W/cm$^2$ and about 5 W/cm$^2$ is delivered to top surface 144. Thus, the surface area is sufficient to allow for a megasonic energy of between about 0.4 Megahertz (MHz) and about 1.5 MHz to deliver the power density of between about 3 W/cm$^2$ and about 5 W/cm$^2$ across the semiconductor substrate.

Figure 4:
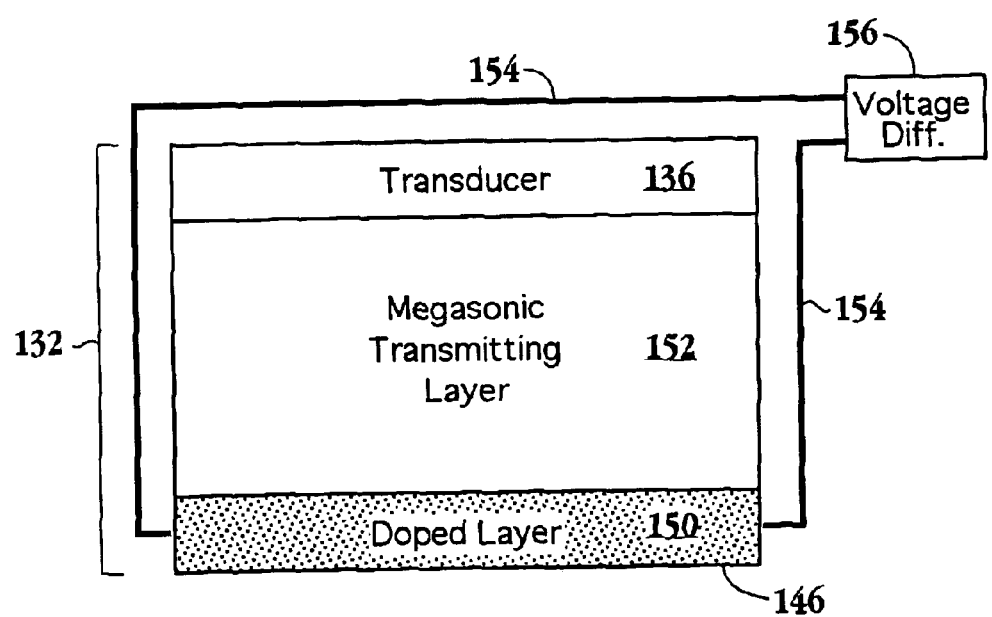
FIG. 4 is a more detailed schematic diagram of a megasonic cleaner in accordance with one embodiment of the invention.

FIG. 4 is a more detailed schematic diagram of a megasonic cleaner in accordance with one embodiment of the invention. Transducer 136 is disposed over megasonic transmitting layer 152 which includes a doped bottom layer 150. Wires 154 provide a conduit between doped bottom layer 150 to apply voltage differential 156 across the doped bottom layer. Thus, an electrical current can be applied across doped bottom layer 150 to locally heat a liquid in contact with the doped layer. In one embodiment, megasonic transmitting layer 152 is composed of Silicon Carbide (SiC) and doped bottom layer 150 of the megasonic transmitting layer is doped with a suitable doping element such as boron, phosphorous, arsenic, antimony, etc., to decrease the resistance of the doped bottom layer. It will be apparent to one skilled in the art that transducer 136 is a piezo-electric device configured to producing megasonic energy. In addition, megasonic transmitting layer 152 may be formed from alternative compounds besides SiC. The alternative compounds are mechanically strong and capable of providing wave-guide like properties to focus the megasonic energy towards a substrate over which megasonic cleaner 132 is disposed, while the alternative compounds are essentially inert to the chemistries being applied. Alternatively, an inert protective coating may be applied to the transducer housing to protect it from degradation by the chemistry used.

It should be appreciated that megasonic transmitting layer 152 can be composed of an insulator in one embodiment. While SiC does possess insulative properties, SiC is also a semiconductor, and as such doping this compound changes it's resistivity. A compound such as, silicon, may be used as a substitute for SiC. Further, a composite megasonic transmitting layer could also be employed utilizing multiple layers of insulating material such as quartz or sapphire, bonded to a conductive heating layer on the bottom surface. The conductive heating layer may be any conductive material which can bond to the insulating layer, allow transmission of the megasonic energy, and be protected from, or inert to, the chemistry used. If a semiconductor-type insulator is utilized, it should be appreciated that the insulator must be capable of being doped and made more conductive by introducing a dopant into a bottom layer of the insulator, thereby reducing the resistivity of the bottom layer. Therefore, heat generated by resistive heating, when a current is applied across the bottom layer, can be transferred to a liquid in contact with the bottom layer of the megasonic cleaner as megasonic energy is simultaneously applied to the liquid an a substrate over which the liquid is disposed.

Figure 5A:
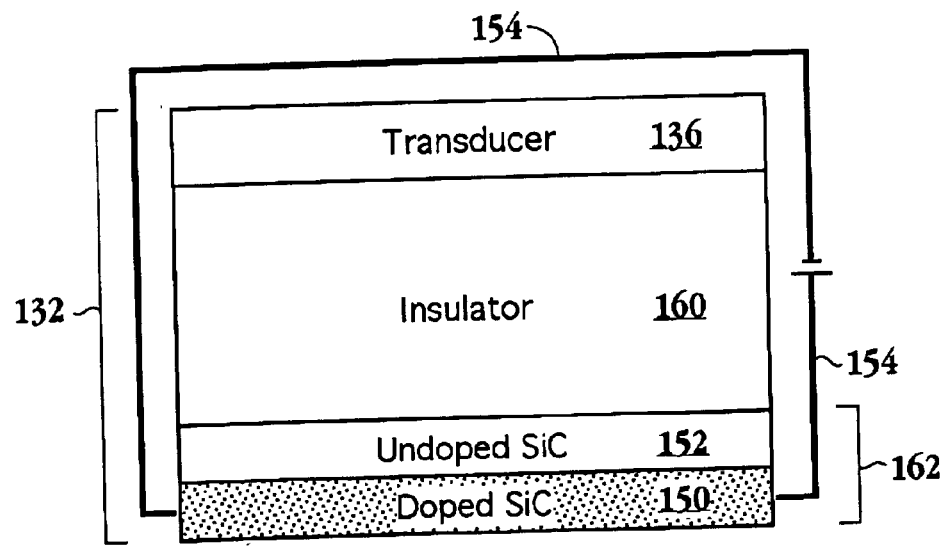
FIG. 5A is a schematic diagram of the components of a megasonic cleaner configured to provide localized heating in accordance with one embodiment of the invention.

FIG. 5A is a schematic diagram of the components of a megasonic cleaner configured to provide localized heating in accordance with one embodiment of the invention. Transducer 136 is disposed over insulator 160 which is disposed over SiC layer 152. Bottom layer 150 of SiC layer 152 is doped to reduce the resistivity of the bottom layer. In one embodiment, the dopant concentration is between about $10^{11}$ atoms/cm$^2$ and about $10^{19}$ atoms/cm$^2$. In a preferred embodiment, the dopant concentration is between about $10^{13}$ atoms/cm$^2$ and about $10^{17}$ atoms/cm$^2$. Thus, when a current is applied across doped bottom layer 150, resistive heating of the doped layer will occur. It should be appreciated that insulator layer 160 insulates transducer 136 from any heat from the resonator, i.e., SiC layer 152 and doped bottom layer 150. In one embodiment, insulator layer 160 is composed of sapphire. Thickness 162 of SiC layer 152 is between about 0.01 mm and about 7 mm. More preferably, thickness 162 is between about 1 mm and about 5 mm. Of course, depending on the configuration of the SiC, i.e., a thin film deposited on an insulator or layer as described with respect to FIG. 4, the thickness may vary accordingly.

Insulator 160 of FIG. 5 has a thickness between about 1 mm and about 5 mm. One skilled in the art will appreciate that transducer 136, insulator 160 and SiC layer 152 are affixed to each other through an adhesive bond. While the bottom surface of bottom layer 150 is shown as being substantially flat, in one embodiment the bottom surface is curved to allow for the improved penetration into high aspect ratio features, as will be explained in more detail below. It should be appreciated that SiC layer 152 can be configured to have multiple resistive layers, where the multiple layers define different gradients of resistivity. The multiple resistive layers are stratified such that bottom doped layer 150 has the lowest resistivity and successive upper layers of the stratification within SiC layer 152 have increasing resistivity. Thus, the layer with the highest resistivity would be at the top of SiC layer 152, thereby offering greater protection to transducer 136 from heat generated through the current applied across bottom doped layer 150.

Figure 5B:
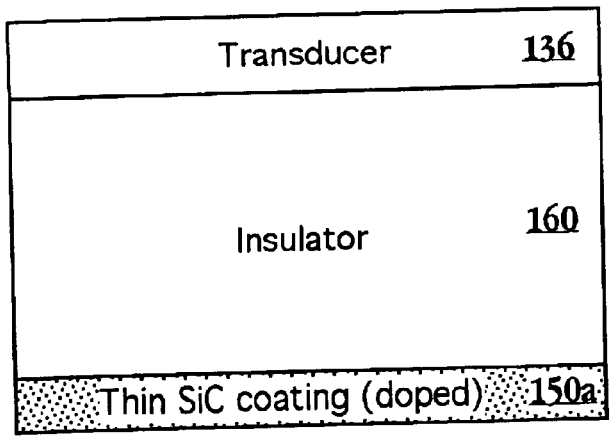
FIG. 5B is a schematic diagram of a resonator for a megasonic cleaner including an insulator upon which a thin Silicon carbide (SiC) coating is deposited in accordance with one embodiment of the invention.

FIG. 5B is a schematic diagram of a resonator for a megasonic cleaner including an insulator upon which a thin SiC coating is deposited in accordance with one embodiment of the invention. Here, transducer 136 is bonded to insulator 160. Insulator 160 can be composed of any suitable insulator such as sapphire, quartz, etc. A thin SiC coating 150a is deposited onto the bottom surface of insulator 160. It will be apparent to one skilled in the art that conventional deposition techniques can be used to deposit thin SiC coating 150a. The appropriate resistivity for thin SiC coating 150a, as discussed above with reference to doped bottom layer 150 of FIG. 5A, can be obtained through either in-situ doping during deposition, or doping separately after deposition. It should be appreciated that a voltage differential is applied across thin SiC coating 150a to provide the resistive heating for a liquid coupling the thin SiC coating to a semiconductor substrate as discussed further below. Additionally, thin SiC coating 150a can be curved outward rather than flat. In one embodiment, insulator 160 has a curved bottom surface and thin SiC coating 150a is deposited evenly over the curved bottom surface of the insulator.

Figure 6:
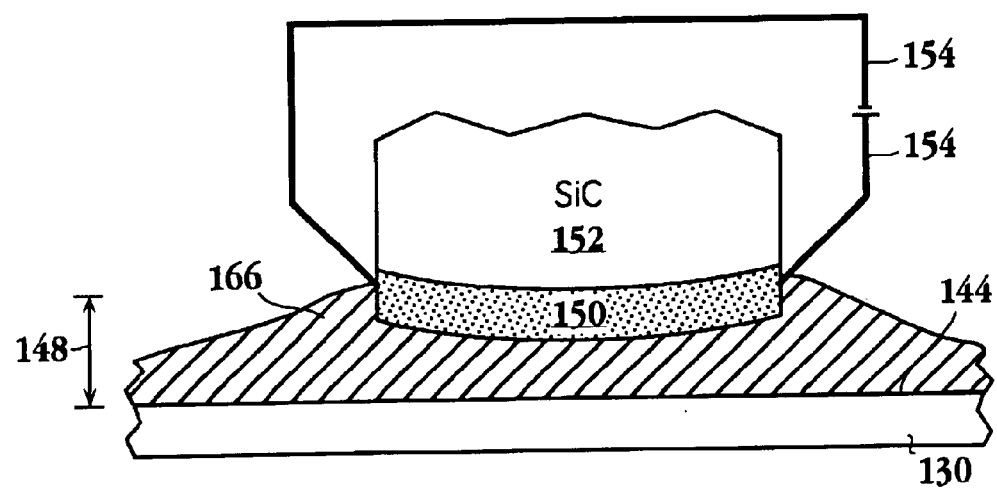
FIG. 6 is an enlarged schematic diagram of a meniscus formed between a megasonic resonator and a liquid disposed over a semiconductor substrate in accordance with one embodiment of the invention.

FIG. 6 is an enlarged schematic diagram of a meniscus formed between a megasonic resonator and a liquid disposed over a semiconductor substrate in accordance with one embodiment of the invention. SiC layer 152 having doped bottom layer 150 is brought into contact with liquid layer 166 without contacting the top surface of substrate 130. Consequently, meniscus 134 is formed between liquid layer 166 and the bottom surface of doped bottom layer 150 of the megasonic resonator. As shown here, the bottom surface of doped bottom layer 150 is curved to produce a lens effect. In one embodiment, the radius of curvature is between about 5 centimeter (cm) and 200 cm. Distance 148 between the bottom surface of doped bottom layer 150 and top surface 144 of substrate 130, as described with reference to FIG. 3, is measured between the low point on the bottom surface of doped bottom layer 150 and top surface 144 of substrate 130. It will be apparent to one skilled in the art that SiC layer 152, in addition to being mechanically strong, provides a good wetting angle with liquid 166 to form meniscus 134. As mentioned previously, liquid 166 includes cleaning chemistries designated for single wafer cleaning processes performed after various semiconductor process steps, such as CMP, etch, deposition, implant, etc.

Still referring to FIG. 6, the resistive heating provided through doped bottom layer 150 transfers heat energy to liquid 166 in order to locally heat the liquid. In one embodiment, the temperature of liquid 166 is controlled between about 20 degrees Celsius (C.) and about 100 degrees C. More preferably, the temperature is controlled between about 30 degrees C. and about 70 degrees C. Of course, the temperature at which the liquid in the region defined under bottom doped layer 150 is dependent on the nature of the cleaning chemistry. That is, the type of process the semiconductor substrate is being cleaned from and the components of the cleaning chemistry determine an optimum temperature to achieve the desired reactivity. The temperature of liquid 166 is controlled and maintained by adjusting the voltage differential applied to bottom doped layer 150. Furthermore, it should be appreciated that the megasonic cleaner may also provide localized heating. Therefore, liquid in a region defined between bottom doped layer 150 and substrate 130 is exposed to heat energy generated by the resistive heating of the bottom doped layer. Thus, as the megasonic cleaner is moved over the surface of the semiconductor substrate during the cleaning operation, the region of liquid defined under the megasonic cleaner is heated concomitantly with the cleaning activity induced by the megasonic cleaner. In one embodiment, the elevated temperature increases the activity of the cleaning chemistry, which in turn decreases the processing time for the cleaning operation resulting in a higher throughput.

Figure 7:
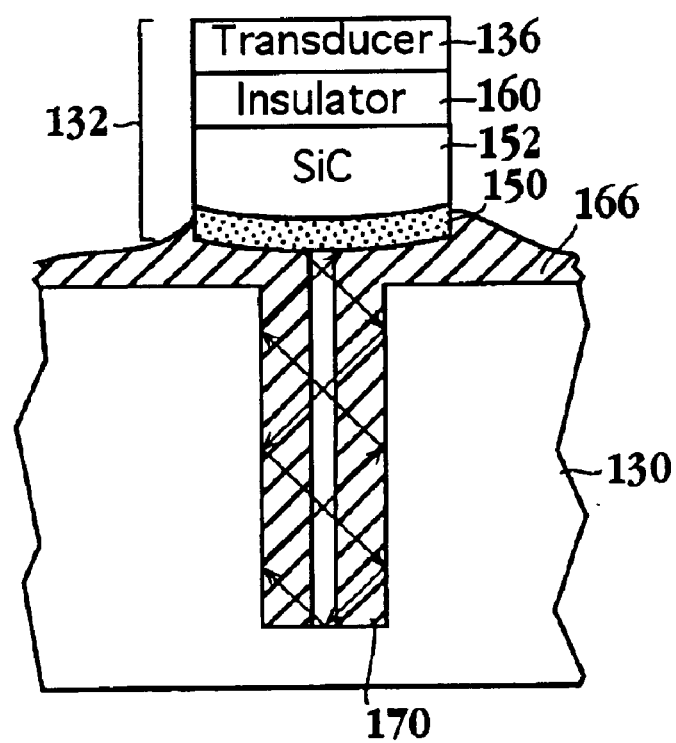
FIG. 7 is a cross sectional schematic diagram of a lens effect provided by a megasonic cleaner having a curved bottom surface to produce a lens effect in accordance with one embodiment of the invention.

FIG. 7 is a cross sectional schematic diagram of a lens effect provided by a megasonic cleaner having a curved bottom surface to produce a lens effect in accordance with one embodiment of the invention. Megasonic cleaner 132 includes transducer 136, insulator 160 and a resonator composed of SiC layer 152 having a bottom doped layer 150. The bottom surface of bottom doped layer 150 is curved in a convex manner, i.e., curved outward. As mentioned above, the radius of curvature is between about 5 cm. and about 200 cm. in one embodiment. The curved bottom provides a lens effect on the megasonic waves. The lens effect causes the megasonic waves to be directed at an angle to the top surface of semiconductor substrate 130. Thus, the sidewalls of high aspect ratio features, such as via 170, are cleaned more effectively. That is, rather than having the megasonic waves directed orthogonally to the top surface of substrate 130, where residues on the sidewalls avoid the cleansing mechanisms associated with the megasonic waves, the lens effect provides an angular orientation for the megasonic waves. Accordingly, the angular orientation directs megasonic waves toward the sidewalls of via 170 so that the sidewalls, and any residues remaining on the sidewalls from the previous fabrication process, experience the cleaning action of the megasonic waves. In particular, the megasonic waves are reflected between the sidewalls rather than solely being reflected off of the bottom of via 170. Thus, curving the bottom surface of the waveguide helps direct megasonic energy to the sidewalls of high aspect ratio features. It should be appreciated that a slight curvature of bottom doped layer 150 assists in preventing air from being trapped between the liquid coupling the megasonic resonator to the substrate to ensure good contact between the resonator and the meniscus defined when the resonator is in contact with the liquid.

Figure 8:
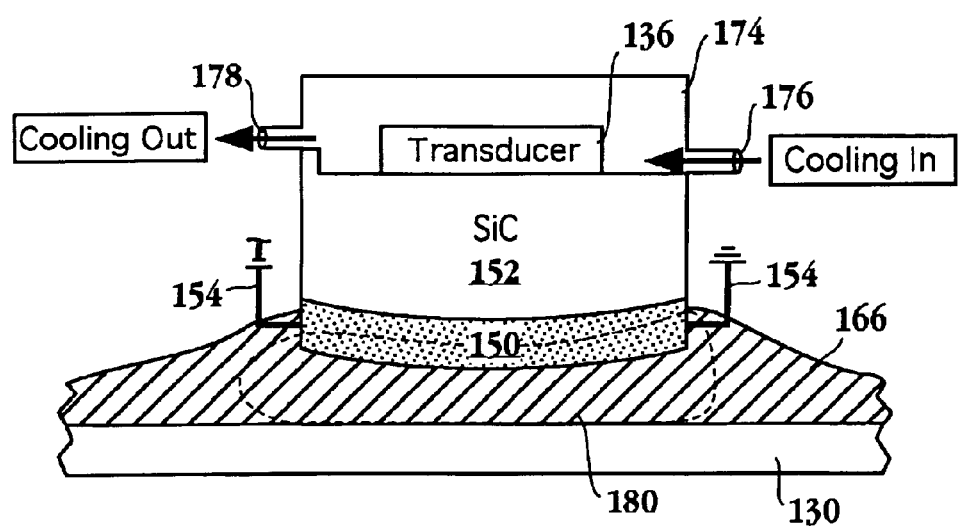
FIG. 8 is a schematic diagram of a side view of a megasonic cleaner configured to provide localized heating and having a cooling loop to prevent the transducer from overheating in accordance with one embodiment of the invention.

FIG. 8 is a schematic diagram of a side view of a megasonic cleaner configured to provide localized heating and having a cooling loop to prevent the transducer from overheating in accordance with one embodiment of the invention. Transducer 136 is contained within housing 174 having inlet 176 and outlet 178. A cooling medium is supplied to housing 174 in order to keep transducer 136 from overheating. Thus, the resonator (SiC layer 152 with bottom doped layer 150) can run at an elevated temperature to provide localized heating to region 180 of liquid 166. It should be appreciated that the resistive heating supplied through bottom doped layer 150 will heat SiC layer 152 in addition to region 180. Accordingly, the cooling loop allows for the dissipation of the heating of SiC layer 152 to protect transducer 136. In one embodiment, the cooling loop is a closed loop so that the cleaning chemistry is not diluted by the transducer cooling. It will be apparent to one skilled in the art that a liquid such as liquid nitrogen or any other suitable liquid compatible with the cooling of transducer 136 can be used here. In addition, transducer 136 can be air cooled by defining a system that forces air past the transducer to provide cooling.

Figure 9:
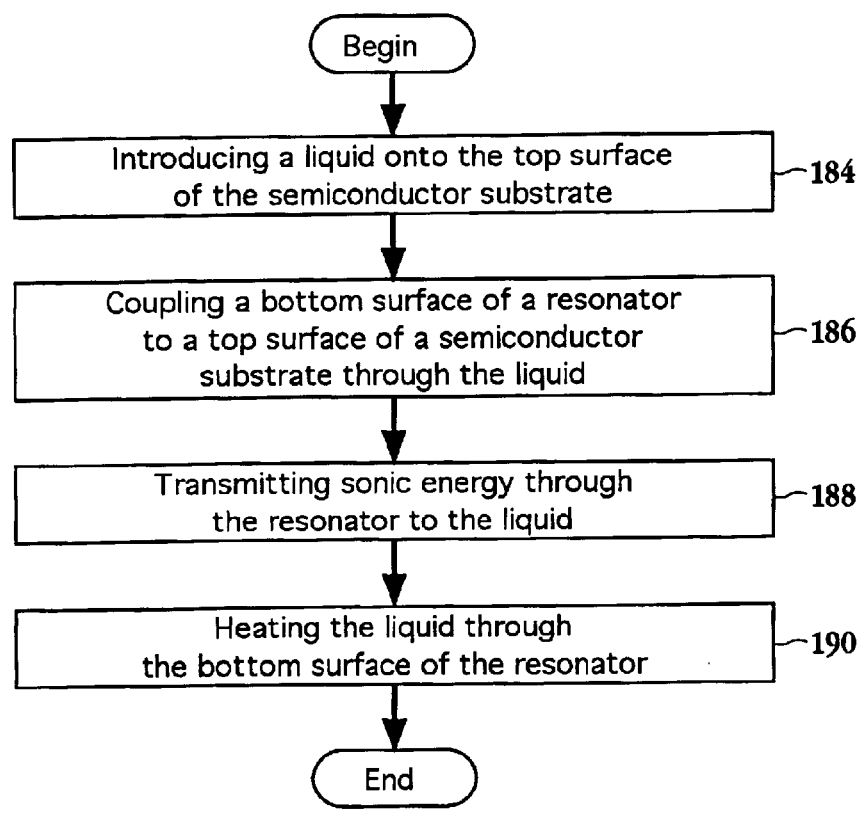
FIG. 9 is a flowchart diagram illustrating the method operations performed for cleaning a semiconductor substrate through megasonic cleaning in accordance with one embodiment of the invention.

FIG. 9 is a flowchart diagram illustrating the method operations performed for cleaning a semiconductor substrate through megasonic cleaning in accordance with one embodiment of the invention. The method initiates with operation 184 where a liquid is introduced onto the top surface of a semiconductor substrate. The liquid can be deionized water (DIW) or a cleaning chemistry designed for a single wafer cleaning process. It should be appreciated that the liquid can be applied continuously during the megasonic cleaning method described herein or the liquid can be puddled onto a top surface of the semiconductor substrate. The method then advances to operation 186 where a bottom surface of a resonator is coupled to the liquid. A suitable resonator is the megasonic resonator of FIGS. 3–7. In one embodiment the bottom surface of the resonator is curved outward and has a radius of curvature between about 5 cm. and about 200 cm. As mentioned above the curved bottom surface enhances the coupling of the resonator to the liquid, as well as providing a lens effect. Moreover, the bottom layer of the resonator is doped in order to provide reduced resistivity for a voltage differential applied across the doped layer, which in turn heats up the bottom layer.

The method of FIG. 9 then proceeds to operation 188 where sonic energy is transmitted through the resonator to the liquid. In one embodiment, the sonic energy is megasonic energy and is transmitted through a silicon carbide (SiC) resonator. Additionally, the resonator is configured to reach sidewalls of high aspect ratio features through the lens effect. As mentioned above, the liquid couples the resonator to the substrate through a meniscus formed when the resonator is brought into contact with the resonator. The method then moves to operation 190 where the liquid is heated through the bottom surface of the resonator. Here, a voltage differential applied across the doped layer results in resistive heating, wherein the heat energy is transferred from the bottom layer to the liquid interface. Consequently, the liquid is heated. In one embodiment, the liquid is a single wafer cleaning chemistry where the reactivity and effectiveness of the cleaning chemistry is increased at an elevated temperature, such as between about 20 degrees C. and about 100 degrees C. The temperature of the liquid is controlled by adjusting a voltage potential to the bottom layer.

In summary, the present invention provides a megasonic resonator having the capability of locally heating a liquid coupling the bottom surface of the resonator to a substrate. The resonator is sized to maintain a low power density. In addition, the resonator is configured to more effectively clean sidewalls of high aspect ratio features through a lens effect of the megasonic waves.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. An apparatus for cleaning a semiconductor substrate, the apparatus comprising:
    a transducer;
    a resonator configured to propagate energy from the transducer, the resonator having a top surface and a bottom surface, the top surface operatively coupled to the transducer, the bottom surface being doped to reduce a resistivity associated with the bottom surface; and
    a process arm supporting the transducer and the resonator over a surface of the semiconductor substrate.

2. The apparatus of claim 1, further including:
    an insulator positioned between the transducer and the resonator.

3. The apparatus of claim 1, wherein the resonator is composed of a Silicon carbide layer having a thickness between about 0.01 millimeter (mm) and about 7 mm.

4. The apparatus of claim 1, wherein the bottom surface is a curved surface.

5. The apparatus of claim 4, wherein the curved surface has a radius of curvature between about 5 centimeters (cm.) and 200 cm.

6. The apparatus of claim 1, further including:
a cooling loop for cooling the transducer, the cooling loop being a closed loop.

7. A system for cleaning a semiconductor substrate, the system comprising:
a substrate support configured to support and rotate a semiconductor substrate about an axis of the semiconductor substrate;
a megasonic cleaner configured to move radially above a top surface of the semiconductor substrate, the megasonic cleaner including;
a transducer;
a resonator configured to propagate energy from the transducer, the resonator having a top surface and a bottom surface, the top surface is operatively coupled to the transducer, the bottom surface is configured to contact a liquid disposed on the top surface of the semiconductor substrate, the bottom surface adapted to heat the liquid in contact with the bottom surface while propagating the energy from the transducer through the liquid to the substrate, wherein the bottom surface includes a dopant causing a reduction of a resistivity of the bottom surface.

8. The system of claim 7, wherein the bottom surface is configured to direct megasonic waves at an angle toward the top surface of the semiconductor substrate.

9. The system of claim 7, wherein a distance from the top surface of the semiconductor substrate to the bottom surface of the resonator is between about 0.5 millimeter and about 5 millimeters.

10. The system of claim 7, wherein the bottom surface is a curved surface.

11. The system of claim 7, wherein the bottom surface is a flat surface.

12. The system of claim 7, wherein the dopant is one of boron, arsenic, phosphorous and antimony.

13. The system of claim 7, wherein a concentration of the dopant is between about $10^{11}$ atoms per square centimeter and about $10^{19}$ atoms per square centimeter.

14. The system of claim 7, wherein the bottom surface includes wire connections for applying a voltage differential across the bottom surface.

15. The system of claim 14, wherein the bottom surface is in electrical communication with a voltage differential source.

16. The system of claim 7, further including: a process arm for supporting the megasonic cleaner, the process arm configured to support the megasonic cleaner over the substrate.

17. The system of claim 14, wherein the transducer is contained within a housing, the housing having at least one port for delivering a cooling medium to the transducer.

18. A method for cleaning a semiconductor substrate, the method comprising method operations of:
introducing a liquid onto a top surface of the semiconductor substrate;
coupling a bottom surface of a resonator to the top surface of the semiconductor substrate through the liquid;
generating sonic energy;
transmitting the sonic energy through the resonator to the liquid;
applying a voltage differential across the bottom surface to generate heat energy; and
heating the liquid with the heat energy.

19. The method of claim 18, wherein the bottom surface has been doped to reduce a resistivity associated with a bottom layer of the resonator.

20. The method of claim 18, wherein the method operation of coupling a bottom surface of a resonator to the top surface of the semiconductor substrate through the liquid further includes:
positioning the resonator over the top surface of the semiconductor substrate such that a distance between the bottom surface of the resonator and the top surface of the semiconductor substrate is between about 0.5 millimeters (mm) and about 5 mm.

21. The method of claim 18, wherein the method operation of transmitting sonic energy through the resonator to the liquid further includes;
maintaining a level of sonic energy delivered to the top surface of the semiconductor substrate between about 3 Watts (W) per square centimeter and about 5 W per square centimeter.

22. A method for applying localized heating to a cleaning chemistry during a cleaning operation of a semiconductor substrate, the method comprising method operations of:
positioning a resonator to contact a surface of a cleaning chemistry applied to a semiconductor substrate; and
applying a voltage differential across a bottom layer of the resonator while transmitting sonic energy from the resonator to the semiconductor substrate through the cleaning chemistry.

23. The method of claim 22, wherein the voltage differential determines a temperature of the cleaning chemistry between the bottom layer of the resonator and top surface of the semiconductor substrate.

24. The method of claim 22 wherein the bottom layer of the resonator has been doped to reduce a resistivity associated with the bottom layer.

* * * * *